United States Patent
Xie et al.

(10) Patent No.: US 9,553,028 B2
(45) Date of Patent: Jan. 24, 2017

(54) METHODS OF FORMING REDUCED RESISTANCE LOCAL INTERCONNECT STRUCTURES AND THE RESULTING DEVICES

(71) Applicant: GLOBALFOUNDRIES Inc., Grand Cayman (KY)

(72) Inventors: Ruilong Xie, Niskayuna, NY (US); Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 170 days.

(21) Appl. No.: 14/219,365

(22) Filed: Mar. 19, 2014

(65) Prior Publication Data
US 2015/0270176 A1 Sep. 24, 2015

(51) Int. Cl.
H01L 21/8234 (2006.01)
H01L 27/088 (2006.01)
H01L 29/66 (2006.01)
H01L 23/485 (2006.01)
(Continued)

(52) U.S. Cl.
CPC . *H01L 21/823475* (2013.01); *H01L 21/76877* (2013.01); *H01L 21/76885* (2013.01); *H01L 21/76895* (2013.01); *H01L 23/485* (2013.01); *H01L 27/088* (2013.01); *H01L 29/665* (2013.01); *H01L 21/76807* (2013.01);
(Continued)

(58) Field of Classification Search
CPC .......... H01L 21/76807; H01L 21/76808; H01L 21/76811; H01L 21/76813; H01L 21/823475; H01L 21/76885; H01L 21/76877; H01L 21/76895; H01L 23/485; H01L 29/665; H01L 27/088; H01L 23/53228; H01L 23/23257; H01L 2924/0002
See application file for complete search history.

(56) References Cited

U.S. PATENT DOCUMENTS

2011/0062502 A1* 3/2011 Yin ................ H01L 21/76816 257/288
2012/0181692 A1* 7/2012 Heinrich .......... H01L 21/76807 257/751
(Continued)

OTHER PUBLICATIONS

Joseph et al., "Advanced Plasma Etch for the 10nm node and Beyond," Proc. of SPIE, vol. 8685, 86850A, 2013.

*Primary Examiner* — Jessica Manno
*Assistant Examiner* — Mohammed R Alam
(74) *Attorney, Agent, or Firm* — Amerson Law Firm, PLLC

(57) ABSTRACT

A method includes forming a layer of insulating material above first and second transistors, within the layer of insulating material, forming a set of initial device-level contacts for each of the first and second transistors, wherein each set of initial device-level contacts comprises a plurality of source/drain contacts and a gate contact, forming an initial local interconnect structure that is conductively coupled to one of the initial device-level contacts in each of the first and second transistors, and removing the initial local interconnect structure and portions, but not all, of the initial device-level contacts for each the first and second transistors. The method also includes forming a copper local interconnect structure and copper caps above the recessed device-level contacts.

17 Claims, 18 Drawing Sheets

(51) Int. Cl.
*H01L 21/768* (2006.01)
*H01L 23/532* (2006.01)

(52) U.S. Cl.
CPC .. *H01L 23/53228* (2013.01); *H01L 23/53257* (2013.01); *H01L 2924/0002* (2013.01)

(56) References Cited

U.S. PATENT DOCUMENTS

2012/0196432 A1* 8/2012 Yan ................... H01L 21/82381
438/586
2012/0261727 A1* 10/2012 Zhong ..................... H01L 29/78
257/288

* cited by examiner

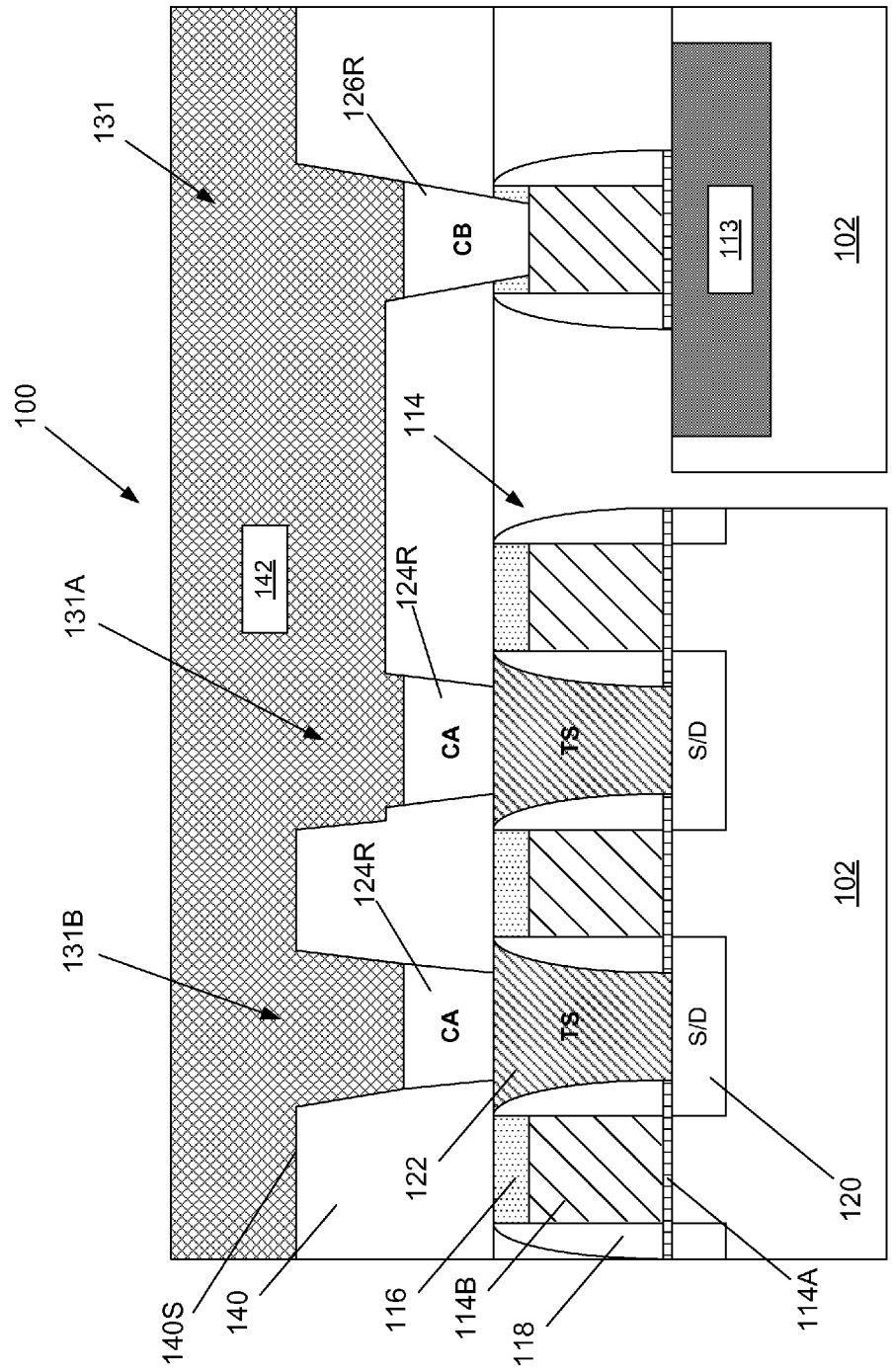

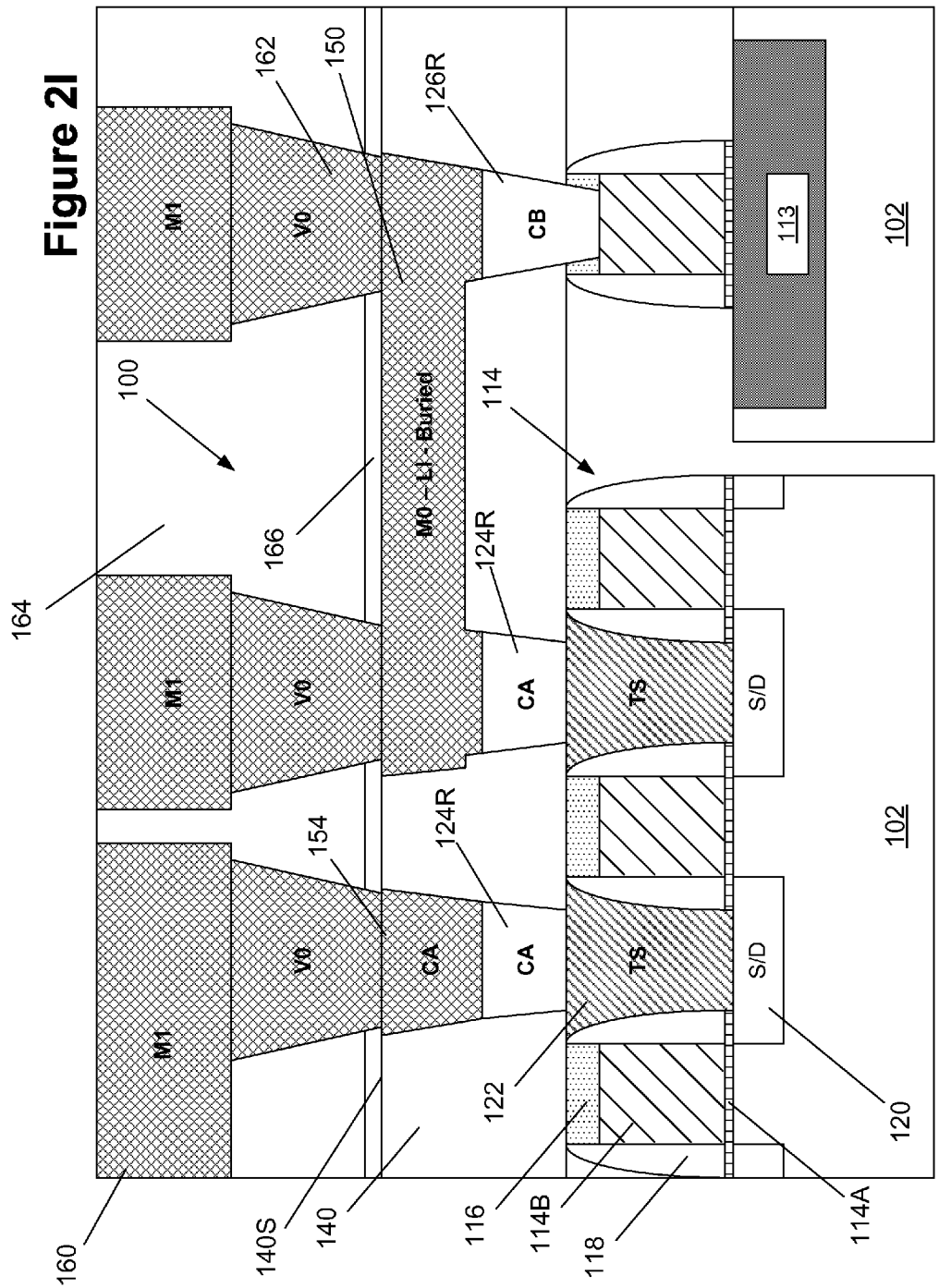

METHODS OF FORMING REDUCED RESISTANCE LOCAL INTERCONNECT STRUCTURES AND THE RESULTING DEVICES

BACKGROUND OF THE INVENTION

1. Field of the Invention

The present disclosure generally relates to the fabrication of integrated circuits, and, more particularly, to various methods of forming reduced resistance local interconnect structures and the resulting semiconductor devices.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In general, as a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

In some cases, the second, upper end of the contact structure may be connected to a contact region of another semiconductor-based circuit element, in which case the interconnect structure in the contact level is also referred to as a local interconnect. These local interconnect structures typically connect circuit elements, e.g., transistors, resistors, etc., that are formed on different spaced-apart active regions that are electrically isolated from one another. Such local interconnect structures are generally line-type structures that are formed in the interlayer dielectric material below the metallization system of the product.

As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels that are positioned above the device contact level, metal lines (M1 and above) and vias (V0 and above) having critical dimensions of approximately 100 nm and significantly less may have to be provided in order to achieve the required packing density in accordance with the density of circuit elements in the device level.

In sophisticated semiconductor devices, tungsten, in combination with appropriate barrier materials, has proven to be a viable contact metal. When forming tungsten-based contact elements, typically, an interlayer dielectric material is formed first and is patterned so as to define contact openings which extend through the interlayer dielectric material to the corresponding contact areas of the circuit elements, i.e., the source/drain region or the gate structure of a transistor.

FIG. 1A is a cross-sectional view of an integrated circuit product 10 comprised of a plurality of transistor devices formed in and above a semiconductor substrate 12. A schematically depicted isolation region 13 has also been formed in the substrate 12. In the depicted example, the transistor devices are comprised of an illustrative gate structure 14, i.e., a gate insulation layer 14A and a gate electrode 14B, a gate cap layer 16, a sidewall spacer 18 and simplistically depicted source/drain regions 20. At the point of fabrication depicted in FIG. 1A, a layer of insulating material 17A, 17B, i.e., the interlayer dielectric, has been formed above the product 10. Other layers of material, such as contact etch stop layers and the like, are not depicted in the attached drawings. Also depicted are illustrative source/drain contact structures 21 which include a combination of a so-called "trench silicide" (TS) structure 22 and a so-called "CA contact" structure 24. Also depicted is a gate contact structure 26 which is sometimes referred to as a "CB contact" structure. The CB contacts 26 are formed so as to contact a portion of the gate electrode 14B of the gate structure 14. In a plan view, the CB contacts 26 are positioned above the isolation region 13, i.e., the CB contacts 26 are not positioned above the active region defined in the substrate 12. The source/drain contact structures 21 are typically formed as line-type structures that extend across the entire width or a significant portion of the active region in the gate-width direction of the transistor devices.

In one embodiment, the process flow of forming the TS structures 22, CA contacts 24 and CB contacts 26 may be as follows. After a first layer of insulating material 17A is deposited, TS openings are formed in the first layer of insulating material 17A that expose portions of underlying source/drain regions 20. Thereafter, traditional silicide is formed through the TS openings followed by forming tungsten (not separately shown) on the metal silicide regions and performing a CMP process down to the top of the gate cap layer 16. Then, a second layer of insulating material 17B is deposited and contact openings for the CA contacts 24 are formed in the second layer of insulating material 17B that expose portions of the underlying tungsten metallization. Next, the opening for the CB contact 26 is formed in the second layer of insulating material 17B and through the gate cap layer 16 so as to expose a portion of the gate electrode 14B. Typically, the CB contact 26 is in the form of a round or square plug. Thereafter, the CA contacts 24 and the CB contact 26 are formed in their corresponding openings in the second layer of insulating material 17B by performing one or more common deposition and CMP process operations, using the second layer of insulating material 17B as a polish-stop layer to remove excess material positioned outside of the contact openings. The CA contacts 24 and CB contact 26 typically contain a uniform body of metal, e.g., tungsten, and may also include one or more metallic barrier layers (not shown) positioned between the uniform body of metal and the layer of insulating material 17B. The source/drain contact structures 21 (TS contacts 22, CA contacts 24) and the CB contact 26 are all considered to be device-level contacts within the industry.

Also depicted in FIG. 1A is the first metallization layer—the so-called M1 layer—of the multi-level metallization system for the product 10. A plurality of conductive vias—so-called V0 vias—are provided to establish electrical connection between the device-level contacts—CA contacts 24 and the CB contact 26—and the M1 layer. The M1 layer typically includes a plurality of metal lines that are routed as needed across the product 10. The M1 lines 30 and the V0 structures are typically comprised of copper, and they are formed in a layer of insulating material 19 using known damascene or dual-damascene techniques. Additional metallization layers (not shown) are formed above the M1 layer, e.g., M2/V1, M3/V2, etc. As depicted, the device-level contacts are all positioned at a level that is below the level of the V0 structures.

FIG. 1B depicts another illustrative arrangement of device-level contacts that may be employed on the product 10. Relative to the example depicted in FIG. 1A, in FIG. 1B, the V0 structures have been omitted and the CA contacts 24 and the CB contact 26 have been extended vertically. In this example, the device-level contacts 24, 26 are all positioned at a level that is below the level of the metal lines in the M1 layer.

FIG. 1C depicts another illustrative arrangement of conductive structures that may be employed on the product 10. In this example, a local interconnect structure 32—a so-called M0 line—is formed in the second layer of insulating material 17B at the same time the CA contacts 24 and the CB contact 26 are formed, and it is formed of the same materials of construction as the CA contacts 24 and the CB contact 26. Use of the local interconnect 32 can be beneficial for several reasons. For example, as depicted in FIG. 1C, due to the presence of the local interconnect 32, the spacing 33 between the V0 vias 28 that are conductively coupled to the CA contacts 24 may be increased, i.e., the left-most V0 via 28 may be shifted to the left due to the existence of the local interconnect 32. In this example, the device-level contacts 21, 26 as well as the local interconnect 32 are all positioned at a level that is below the level of the V0 structures 28.

FIG. 1D is a plan view of a portion of an integrated circuit product that depicts further examples of where a local interconnect structure (M0) may be employed. As shown therein, a first transistor 10A is formed above a first active region (Active 1) while second and third transistors (10B, 10C) are formed above a second active region (Active 2). The spaced-apart active regions are electrically isolated from one another by isolation material (not shown). As depicted therein, line-type CA contacts (CA) are formed above each of the source/drain regions (S/D Region), while CB contacts (CB1-CB3) are formed for each of the gates structures (Gates 1-3). As mentioned previously, the CB contacts are positioned above the isolation material. As depicted, a first local interconnect structure (M0-1) is coupled to a CA contact of transistor 10A and to CB2 contact for Gate 2 of the second transistor 10B. By using the first local interconnect structure (M0-1), the distance 35 between the CB2 contact and the CA contacts on the second transistor 10B may be maintained at an acceptable distance to avoid shorting. A second local interconnect structure (M0-2) is coupled to CB1 contact for Gate 1 of the first transistor 10A and to CB3 contact for Gate 3 of the third transistor 10C. Due to the presence of the second local interconnect structure (M0-2), Gate 1 can be coupled to Gate 3 without shorting to Gate 2.

While all of the various formations of device-level contact structures and local interconnect structures discussed above are possible, another problem that is present with such conductive structures is the overall resistance of the device-level contacts, and particularly the local interconnect structures. The present disclosure is directed to various methods of forming reduced resistance local interconnect structures and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming reduced resistance local interconnect structures and the resulting semiconductor devices. One method disclosed herein includes, among other things, forming a layer of insulating material above first and second transistors that are formed above first and second spaced-apart active regions, respectively, within the layer of insulating material, forming a set of initial device-level contacts for each of the first and second transistors, wherein each set of initial device-level contacts comprises a plurality of source/drain contacts and a gate contact, forming an initial local interconnect structure that is conductively coupled to one of the initial device-level contacts of the first transistor and conductively coupled to one of the initial device-level contacts of the second transistor, and performing at least one recess etching process so as to remove the initial local interconnect structure and portions, but not all, of the initial device-level contacts for each of the first and second transistors so as to thereby define a local interconnect recess and a plurality of recessed device-level contacts for each of the first and second transistors. The method further includes forming a copper local interconnect structure in the local interconnect recess that is conductively coupled to one of the recessed device-level contacts of the first transistor and conductively coupled to one of the recessed device-level contacts of the second transistor, and forming a copper cap above each of the recessed device-level contacts of the first and second transistors that are not conductively coupled to the copper local interconnect structure.

Another illustrative method disclosed herein includes, among other things, forming a layer of insulating material above first and second transistors that are formed above first and second spaced-apart active regions, respectively, within the layer of insulating material, forming a set of initial device-level contacts for each of the first and second transistors, wherein each set of initial device-level contacts comprises a plurality of source/drain contacts and a gate contact, and forming an initial local interconnect structure that is conductively coupled to one of the initial device-level contacts of the first transistor and conductively coupled to one of the initial device-level contacts of the second transistor, performing at least one recess etching process so as to remove the initial local interconnect structure and portions, but not all, of the initial device-level contacts for each of the first and second transistors so as to thereby define a local interconnect recess in the layer of insulating material and a plurality of recessed device-level contacts for each of the first and second transistors, forming a layer of copper so as to over-fill the local interconnect recess and an opening in the layer of insulating material above each of the recessed device-level contacts, wherein the layer of copper has a substantially planar upper surface that is positioned above an upper surface of the layer of insulating material and wherein formation of the layer of copper results in the formation of a copper local interconnect structure in the local interconnect recess that is conductively coupled to one of the recessed device-level contacts of the first transistor and conductively coupled to one of the recessed device-level contacts of the second transistor and a copper cap above each of the recessed device-level contacts of the first and second transistors that are not conductively coupled to the copper local interconnect structure. In this embodiment, the method further includes forming a patterned etch mask above the upper surface of the layer of copper and performing an etching process through the patterned etch mask to remove portions of the layer of copper positioned above the upper surface of the layer of insulating material so as to thereby define a copper line that is formed integral with the copper local interconnect structure and a copper via that is formed integral with at least one of the copper caps, wherein the copper line and the via are positioned above the upper surface of the layer of insulating material.

One illustrative device disclosed herein includes, among other things, at least first and second transistors positioned above first and second spaced-apart active regions, respectively, a layer of insulating material positioned above the first and second transistors, a set of recessed device-level contacts for each of the first and second transistors, wherein the recessed device-level contacts are positioned in the layer of insulating material and wherein each set of recessed device-level contacts comprises a plurality of recessed source/drain contacts and a recessed gate contact, a copper local interconnect structure that is conductively coupled to one of the recessed device-level contacts of the first transistor and conductively coupled to one of the recessed device-level contacts of the second transistor, wherein the copper local interconnect structure is positioned in the layer of insulating material, and a plurality of copper caps, each of which is conductively coupled to one of the recessed device-level contacts of the first and second transistors that are not conductively coupled to the copper local interconnect structure, wherein each of the copper caps is positioned in the layer of insulating material.

BRIEF DESCRIPTION OF THE DRAWINGS

The disclosure may be understood by reference to the following description taken in conjunction with the accompanying drawings, in which like reference numerals identify like elements, and in which:

FIGS. 2A-2I depict various methods disclosed herein of forming reduced resistance local interconnect structures and the resulting semiconductor devices.

Figure 1A:
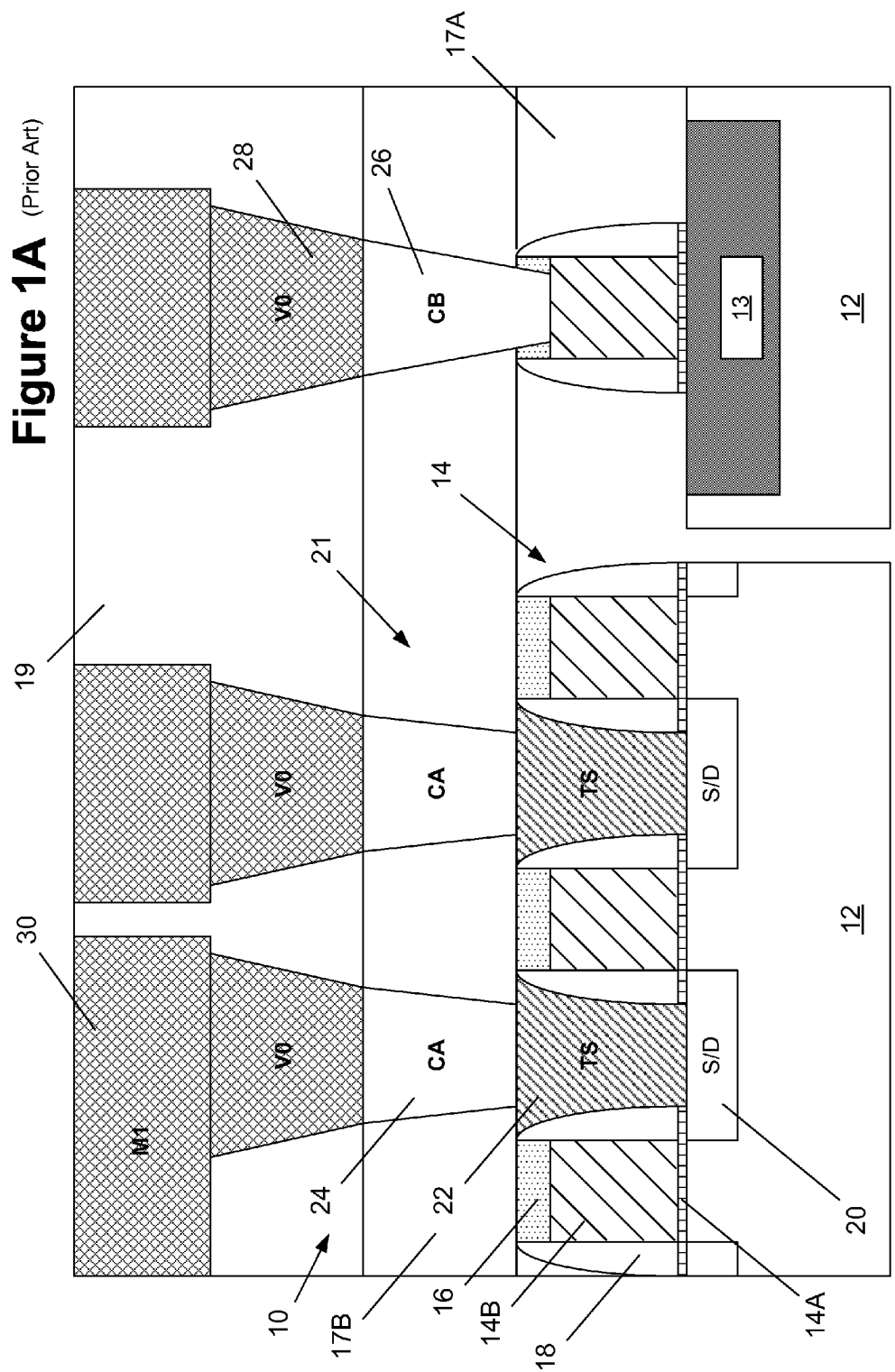
FIGS. 1A-1D depict various illustrative prior art arrangements of device-level contacts and metallization layers for an integrated circuit product.
Figure 1B:
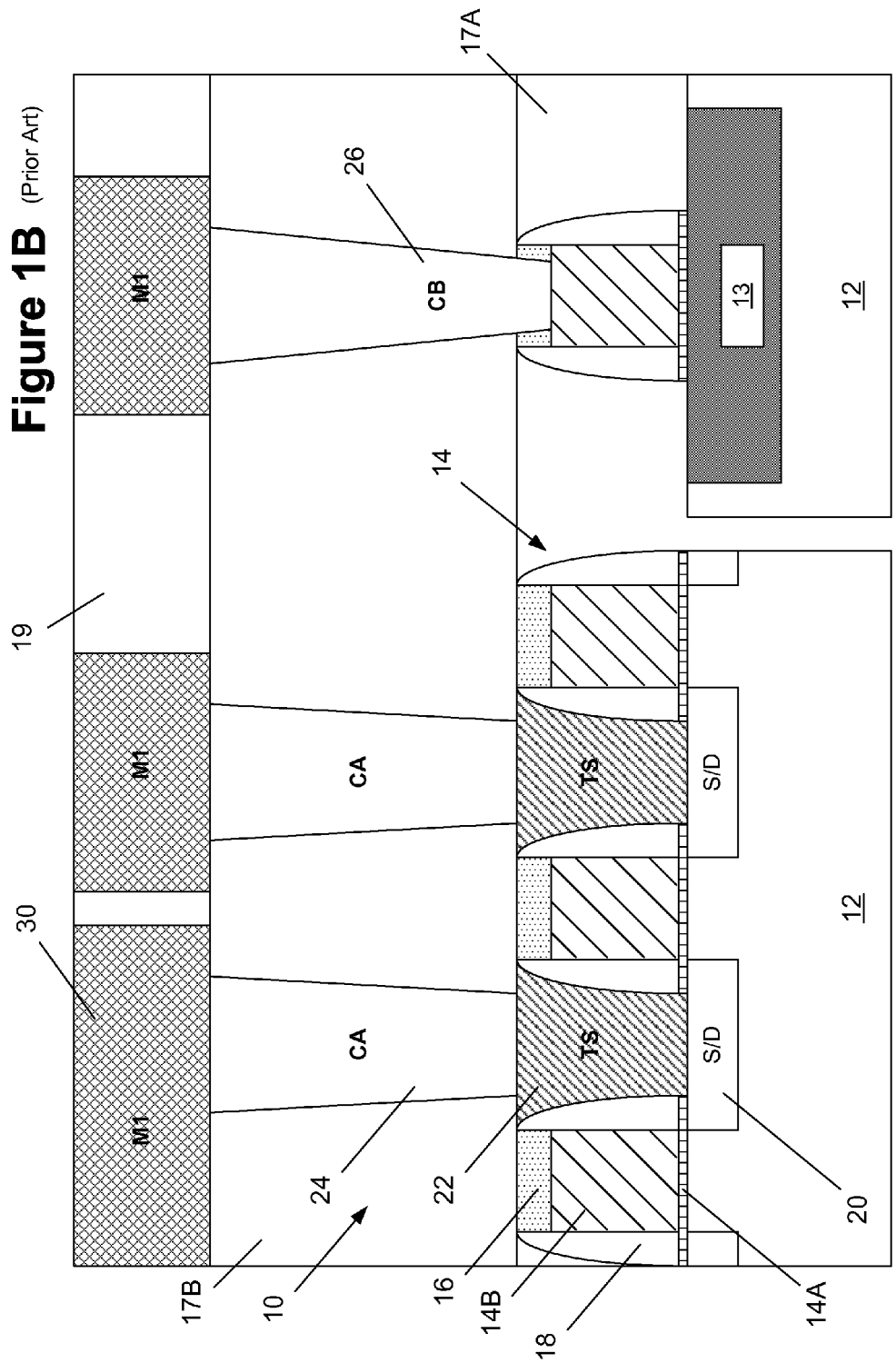
Figure 1C:
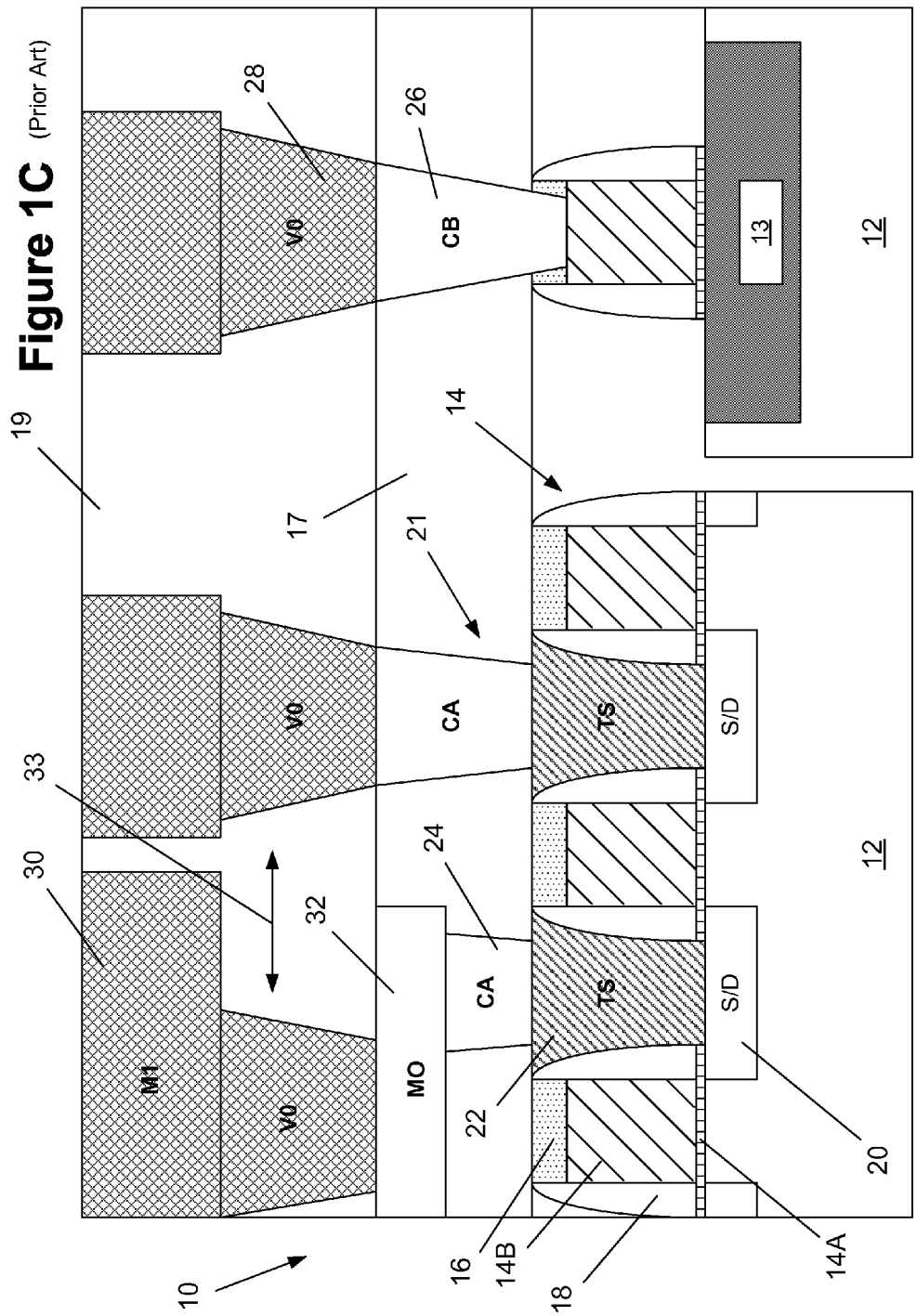
Figure 1D:
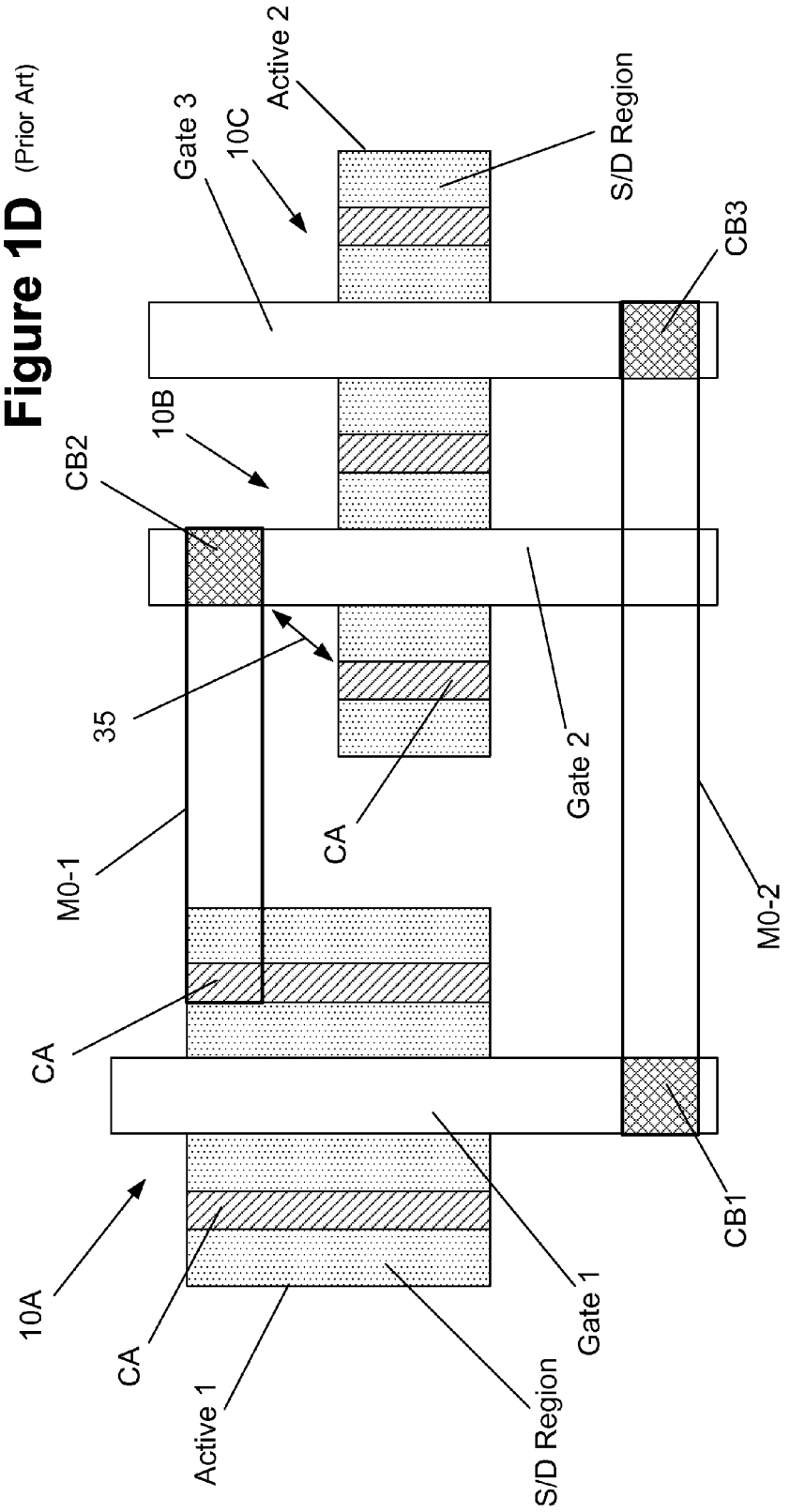

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming reduced resistance local interconnect structures and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2I depict various methods disclosed herein of forming reduced resistance local interconnect structures and the resulting semiconductor devices. The illustrative product 100 will be formed in and above a semiconductor substrate 102. The transistor devices depicted herein may be either NMOS or PMOS transistors, and they may be any type of transistor device, e.g., either planar or FinFET transistor devices. Additionally, various doped regions, e.g., halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

Figure 2A:
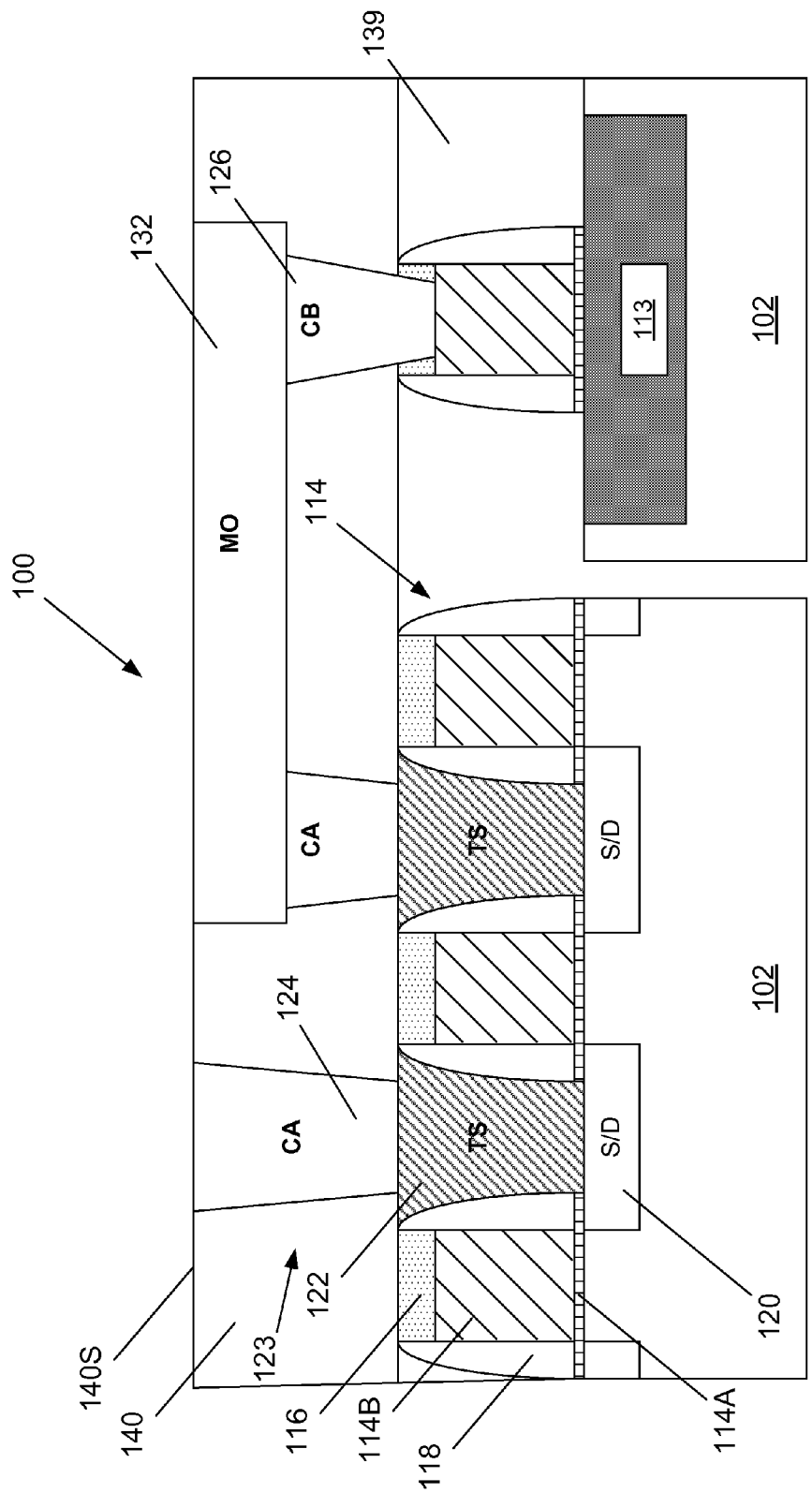
Figure 2B:
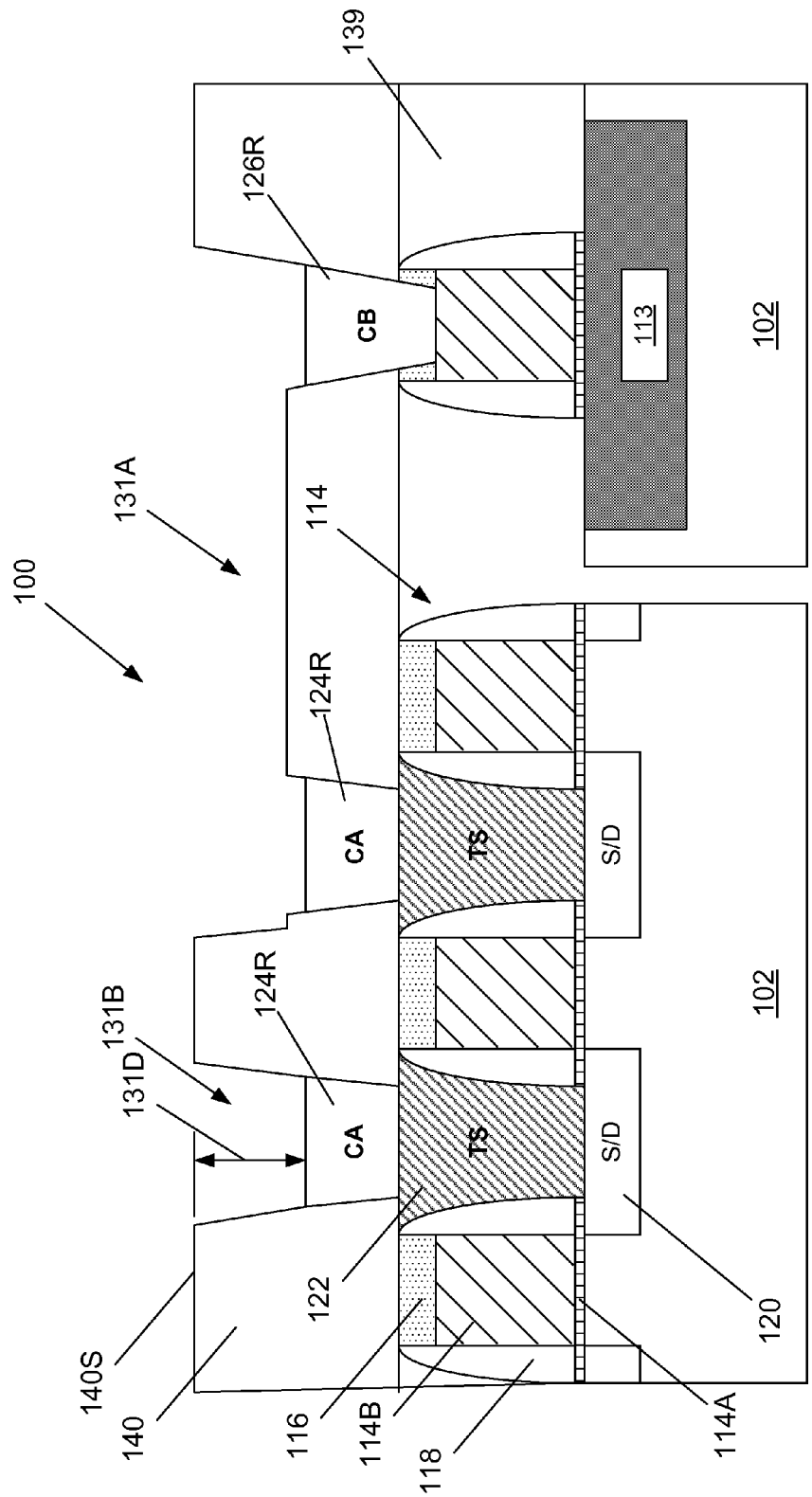

FIG. 2A is a cross-sectional view of an integrated circuit product 100 comprised of a plurality of transistor devices formed in and above the semiconductor substrate 102. A schematically depicted isolation region 113, e.g., a shallow trench isolation region, has also been formed in the substrate 102. In the depicted example, the transistor devices are comprised of an illustrative gate structure 114, a gate cap layer 116, a sidewall spacer 118 and simplistically depicted source/drain regions 120. In one illustrative embodiment, the schematically depicted gate structure 114 includes an illustrative gate insulation layer 114A and an illustrative gate electrode 114B. The gate insulation layer 114A may be comprised of a variety of different materials, such as, for example, silicon dioxide, a so-called high-k (k greater than 10) insulation material (where k is the relative dielectric constant), etc. Similarly, the gate electrode 114B may also be of a material such as polysilicon or amorphous silicon, or it may be comprised of one or more metal layers that act as the gate electrode 114B. As will be recognized by those skilled in the art after a complete reading of the present application, the gate structure 114 of the transistor devices depicted in the drawings, i.e., the gate insulation layer 114A and the gate electrode 114B, is intended to be representative in nature. That is, the gate structure 114 may be comprised of a variety of different materials and it may have a variety of configurations, and the gate structure 114 may be made using either the so-called "gate-first" or "replacement gate" techniques.

With continuing reference to FIG. 2A, first and second layers of insulating material 139, 140, i.e., the interlayer dielectric, have been formed above the product 100. The layers of insulating material 139, 140 may be made from a variety of materials, e.g., silicon dioxide, and they may be formed by performing, for example, a CVD process. The layers of insulating material 139, 140 may be made of the same or different materials. Other layers of material, such as a contact etch stop layer and the like, are not depicted in the attached drawings. Also depicted are illustrative initial source/drain contact structures 123, which include a combination of a so-called "trench silicide" (TS) structure 122 and a so-called initial "CA contact" structure 124. Also depicted is an initial gate contact structure 126 which is sometimes referred to as a "CB contact" structure and an initial local interconnect (M0) line 132. The initial CB contact 126 is formed so as to contact a portion of the gate electrode 114B of the gate structure 114. As noted in the background section of this application, the initial CB contact 126 is positioned above the isolation region 113, i.e., the initial CB contact 126 is not positioned above the active region defined in the substrate 102. The source/drain contact structures 123 are typically formed as line-type structures that extend across the entire width or a significant portion of the active region in the gate-width direction of the transistor devices. In the depicted example, the initial local interconnect 132 is conductively coupled to one of the CA contacts 124 of a first transistor that is formed above a first active region, and a CB contact 126 of a second transistor that is formed above a second active region that is spaced apart from the first active region. Of course, as will be appreciated by those skilled in the art, the initial local interconnect 132 may be conductively coupled to any desired structures on two different transistor devices that are formed above two different active regions, e.g., it may conductively couple two CA contacts 124, two CB contacts 126 or, as depicted, a CA contact 124 and a CB contact 126.

In one embodiment, the process flow of forming the TS structures 122, the initial CA contacts 124, the initial CB contact 126 and the initial local interconnect 132 may be as follows. After the first layer of insulating material 139 is deposited, TS openings are formed in the first layer of insulating material 139 that expose portions of underlying source/drain regions 120. Thereafter, traditional silicide is formed through the TS openings, followed by forming tungsten (not separately shown) on the metal silicide regions and performing a CMP process down to the top of the gate cap layer 116. Then, the second layer of insulating material 140 is deposited and contact openings for the initial CA contacts 124 are formed in the layer of insulating material 140 (and perhaps an underlying etch stop layer (not shown)) that expose portions of the underlying tungsten metallization portion of the TS structures 122. Next, the contact opening for the CB contact 126 and the trench for the initial local interconnect 132 is formed in the second layer of insulating material 140. The opening for the initial CB contact 126 also extends through the gate cap layer 116 so as to expose a portion of the gate electrode 114B. Typically, the initial CB contact 126 is in the form of a round or square plug. The initial local interconnect 132 may span any distance and run in any direction. Thereafter, the initial CA contacts 124, the initial CB contact 126 and the initial local interconnect 132 are formed in their corresponding openings/trench by performing one or more common deposition and CMP process operations, using the second layer of insulating material 140 as a polish-stop layer to remove excess material that is positioned outside of the openings/trench above the surface 140S of the second layer of insulating material 140. At this point in the fabrication, the initial CA contacts 124, the initial CB contact 126 and the initial local interconnect 132 are typically comprised of a uniform body of metal, e.g., tungsten, and may also include one or more metallic barrier layers (not shown) positioned between the uniform body of metal and the second layer of insulating material 140. The initial CA contacts 124, the TS contacts 122 and the initial CB contact 126 are all considered to be device-level contacts within the industry.

At the point of fabrication depicted in FIG. 2A, using prior art techniques, the process of forming the metallization system for the product 100 would begin, i.e., the V0 structures and the M1 metallization layer would be formed above the second layer of insulating material 140. However, with reference to FIG. 2B, unlike prior art methods, the novel methods disclosed herein involve performing one or more timed, recess etching process(es) to remove the initial local interconnect 132 and portions of the initial CA contacts 124 and the initial CB contact 126. This results in the formation of an interconnect recess 131A and a contact recess 131B in the second layer of insulating material 140 and the formation of a plurality of recessed device-level contacts, i.e., the recessed CA contacts 124R and a recessed CB contact 126R. The depth 131D of the recesses 131A-B may vary depending upon the particular application, e.g., 30-60 nm depending upon the thickness of the initial local interconnect 132. In the depicted example, the entirety of the initial local interconnect 132 is removed during the etching process. However, in some applications, less than the entire thickness of the initial local interconnect may be removed, i.e., the initial local interconnect 132 may be recessed to some degree.

FIG. 2C depicts the product after a layer of copper 142 has been formed so as to over-fill the recesses 131A-B using traditional copper formation techniques, e.g., electroplating, electroless deposition, etc. Various barrier layers and seed layers that are formed as part of the process of forming the layer of copper 142 are not depicted so as not to obscure the present inventions. The layer of copper 142 may be formed to any desired thickness.

Figure 2D:
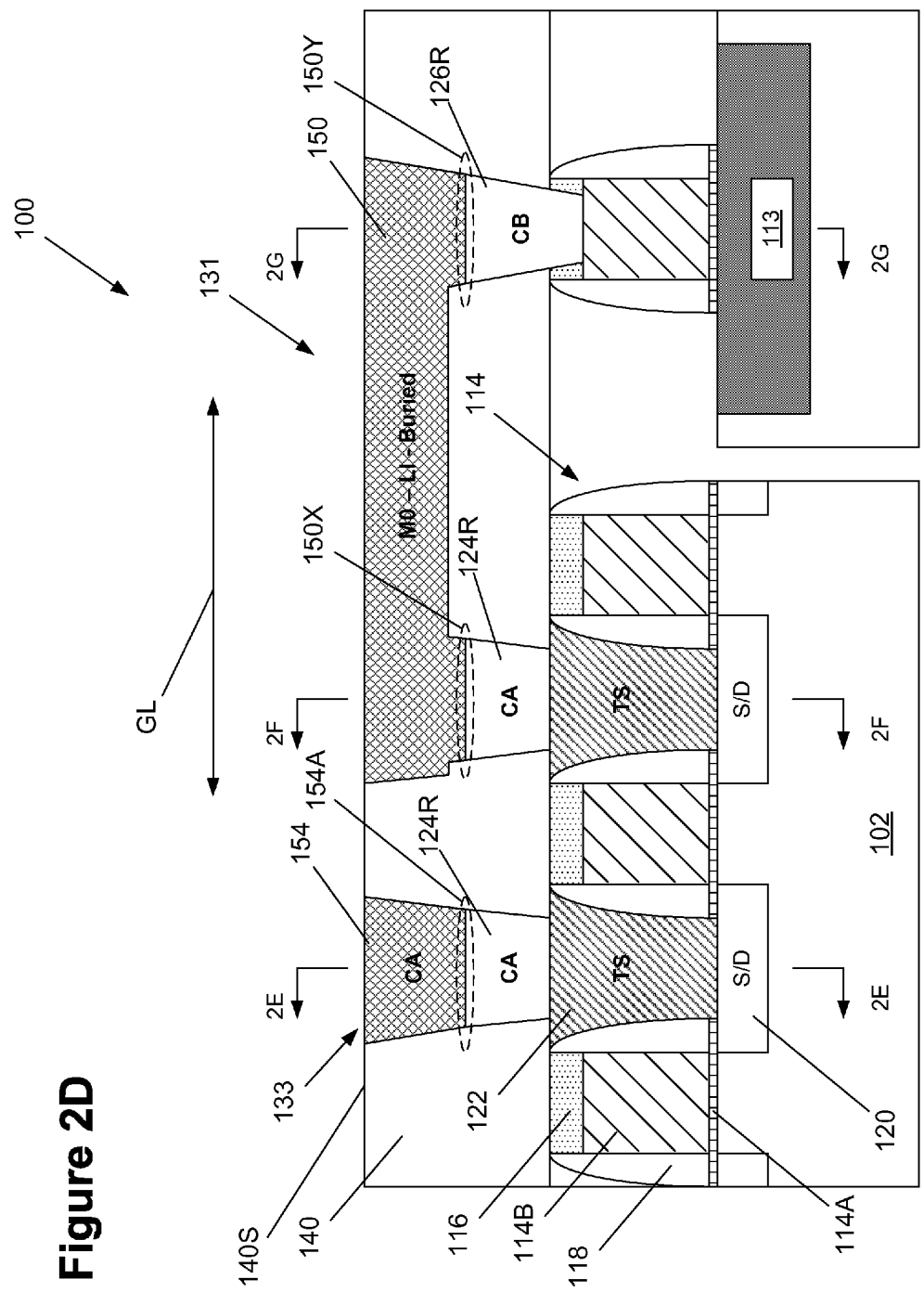

FIG. 2D depicts the product 100 after one or more planarization processes (e.g., CMP) were performed on the layer of copper 142 using the second layer of insulating material 140 as a polish-stop layer. This results in the formation of a copper local interconnect 150 that exhibits a lower electrical resistance as compared to the initial tungsten local interconnect 132. The copper local interconnect 150 may be considered to be a buried local interconnect (M0-LI-Buried) in the sense that it is "buried" in the second layer of insulating material 140. Additionally, these process operations result in the formation of a composite CA contact 133 comprised of the recessed CA contact 124R, made of, for example, tungsten, and a copper cap 154. Also note that a portion of the copper local interconnect 150 serves as the contact cap 154 for the recessed CA contact 124R and the CB contact 126R to which it is coupled. Contact caps 154 will be formed above all of the recessed device-level contacts on the two spaced-apart transistors, e.g., 124 and/or 126, that are not conductively coupled to the copper local interconnect 150.

Figure 2E:
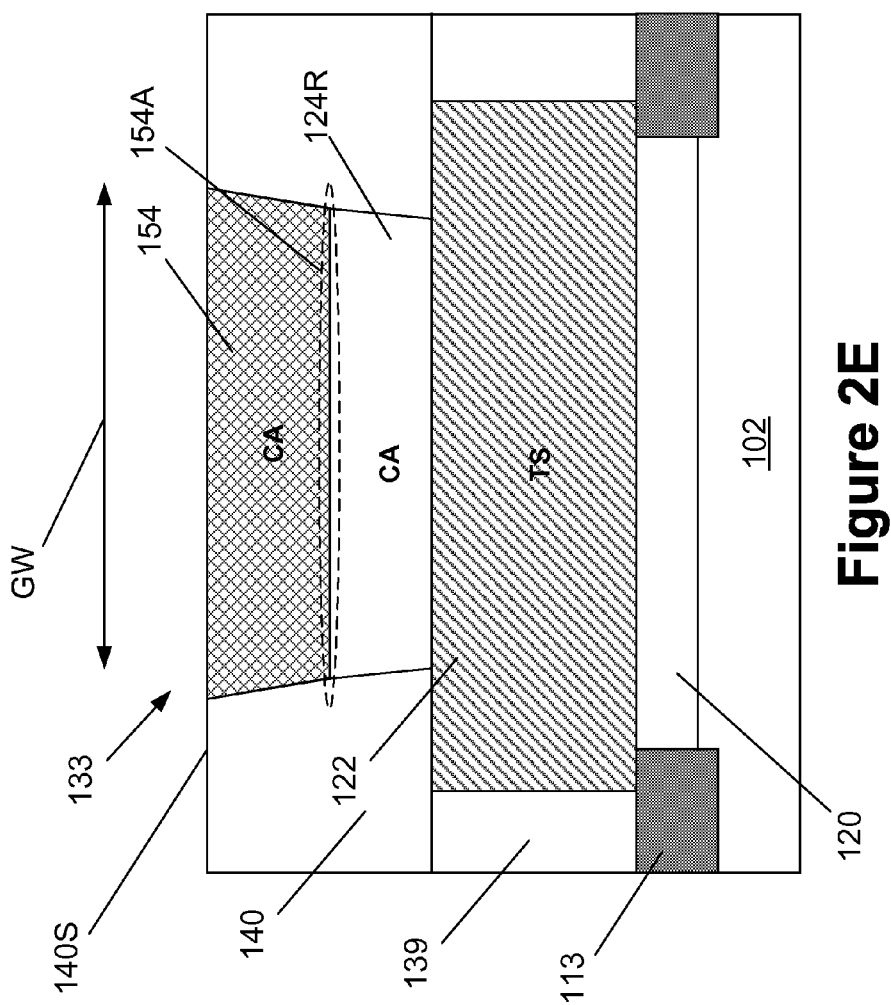
Figure 2F:
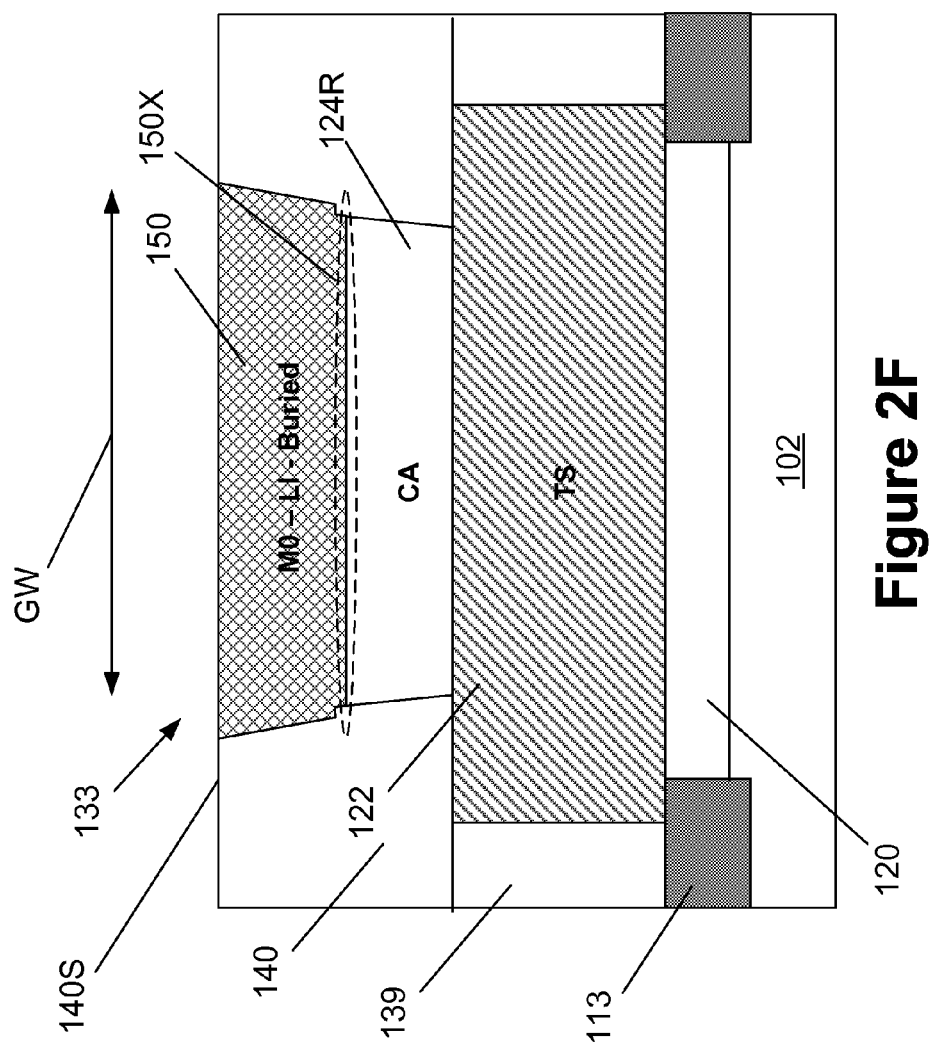
Figure 2G:
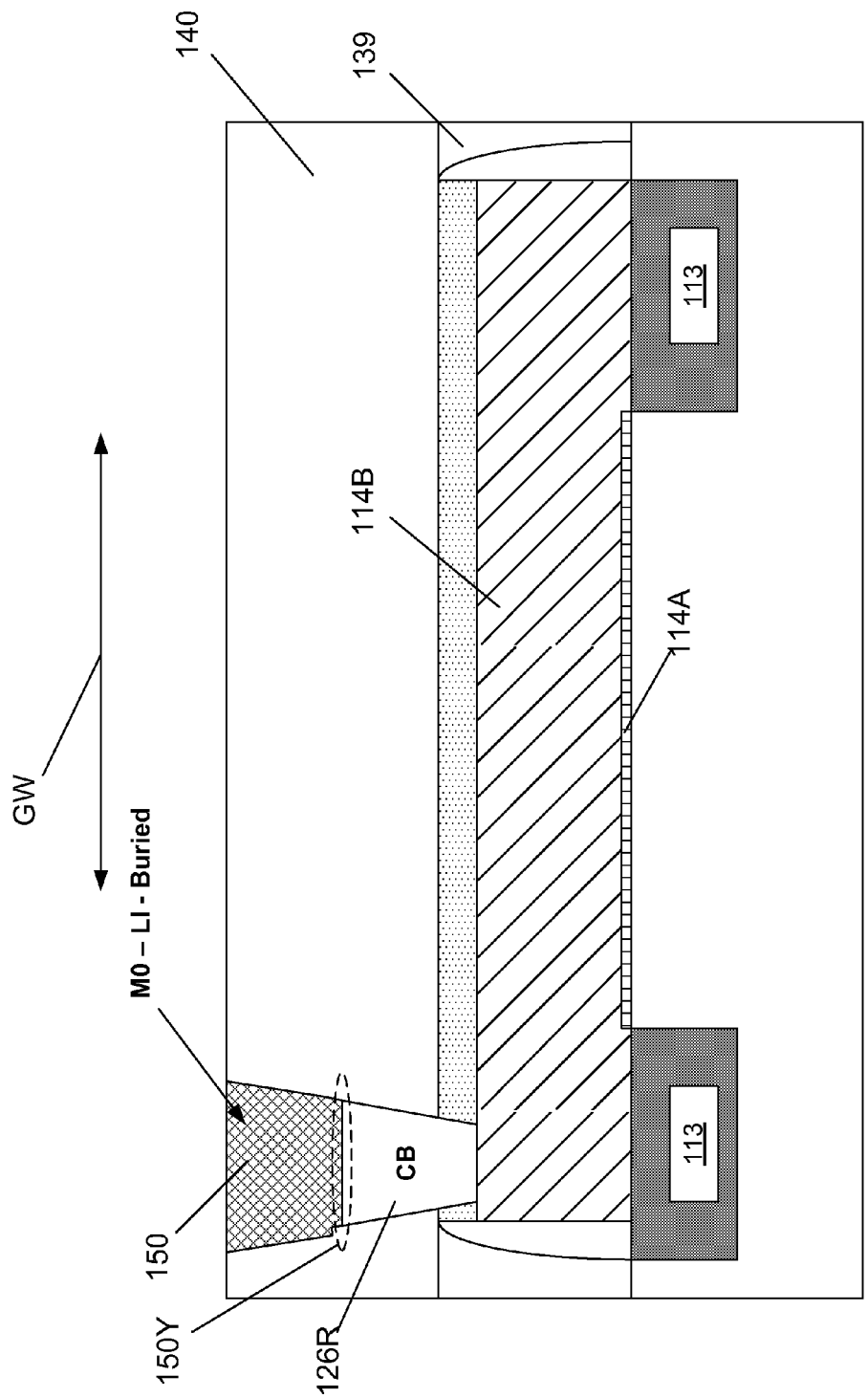

Further, using the methods disclosed herein, the copper local interconnect 150 and contact caps 154 are substantially self-aligned with respect to the underlying recessed CA contacts 124R and recessed CB contact 126R due to the manner in which they are formed. By use of the phrase "substantially self-aligned" with respect to the various interfaces discussed herein and in the claims, it is meant that the interfacing footprint of each of the two interfacing components are substantially the same, i.e., substantially the same size (area wise) and substantially the same configuration at the location of the interface. As shown in FIGS. 2D and 2E, the interface 154A between the copper cap 154 and the underlying recessed CA contact 124R is substantially self-aligned in both the gate length direction (GL—FIG. 2D) and gate width (GW—FIG. 2E) direction of the transistor devices. Similarly, the interfaces 150X and 150Y between the copper local interconnect 150 and the structures to which it is coupled are substantially self-aligned in both the gate length direction (GL—FIG. 2D) and gate width (GW—FIG. 2E) direction of the transistor devices. More specifically, as shown in FIGS. 2D and 2F, the interface 150X between the copper local interconnect 150 and the underlying recessed CA contact 124R is substantially self-aligned in both the gate length direction (GL—FIG. 2D) and gate width (GW—FIG. 2F) direction of the transistor devices. As shown in FIGS. 2D and 2G, the interface 150Y between the copper local interconnect 150 and the underlying recessed CB contact 126R is substantially self-aligned in both the gate length direction (GL—FIG. 2D) and gate width (GW—FIG. 2G) direction of the transistor devices. Lastly, note that the recessed CA contacts 124R, recessed CB contact 126R, the copper local interconnect 150 and the CA contact cap 154 are all positioned within a single layer of insulating material, e.g., the interlayer dielectric layer 140.

Figure 2H:
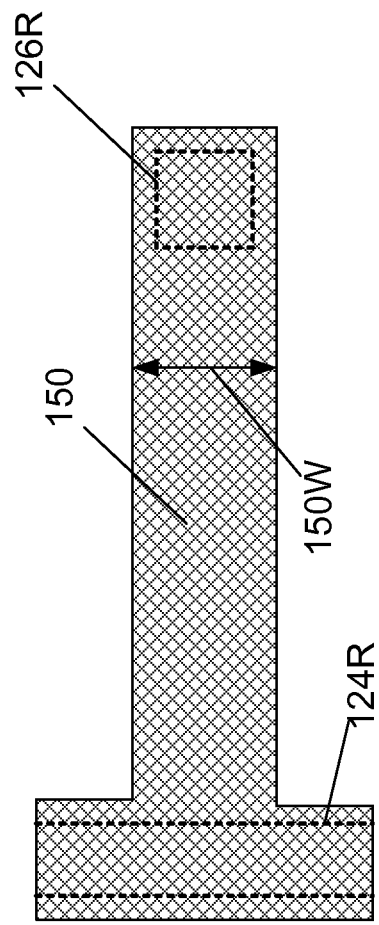
Figure 2H:
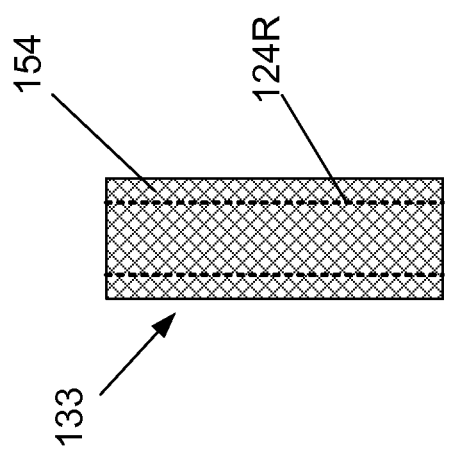

FIG. 2H is a simplistic plan view showing one possible embodiment of the recessed CA contacts 124R, the recessed CB contact 126R, the copper local interconnect 150 and the CA contact cap 154, with the layer of insulating material 140 and other structures omitted. In this embodiment, the recessed CA contacts 124R are line-type structures, the CA contact cap 154 is a line-type structure, the recessed CB contact 126R has a generally square configuration and the copper local interconnect 150 has an overall T-shaped configuration. Of course, the copper local interconnect 150 may have other configurations and its width 150W may vary depending upon the particular application. Since the copper local interconnect 150 has a reduced resistance relative to a traditional tungsten local interconnect, the width 150W may be less than the corresponding width of a tungsten local interconnect, thereby reducing crowding in the area of the device-level contacts.

FIG. 2I depicts the product 100 after the formation of the first metallization layer—the M1 layer—of the multi-level metallization system for the product. The M1 layer contains a plurality of metal lines 160. A plurality of conductive vias 162—V0 vias—are provided to establish electrical connection between the device-level contacts and the M1 layer. The M1 layer and the vias 162 are formed in another layer of insulating material 164 and an etch-stop layer 166 is formed between the layers of insulating material 140, 164. The M1 lines 160 and the V0 structures 162 are typically comprised of copper, and they are typically formed in the layer of insulating material 164 using known damascene or dual-damascene techniques. Additional metallization layers (not shown) are formed above the M1 layer, e.g., M2/V1, M3/V2, etc.

Figure 3A:
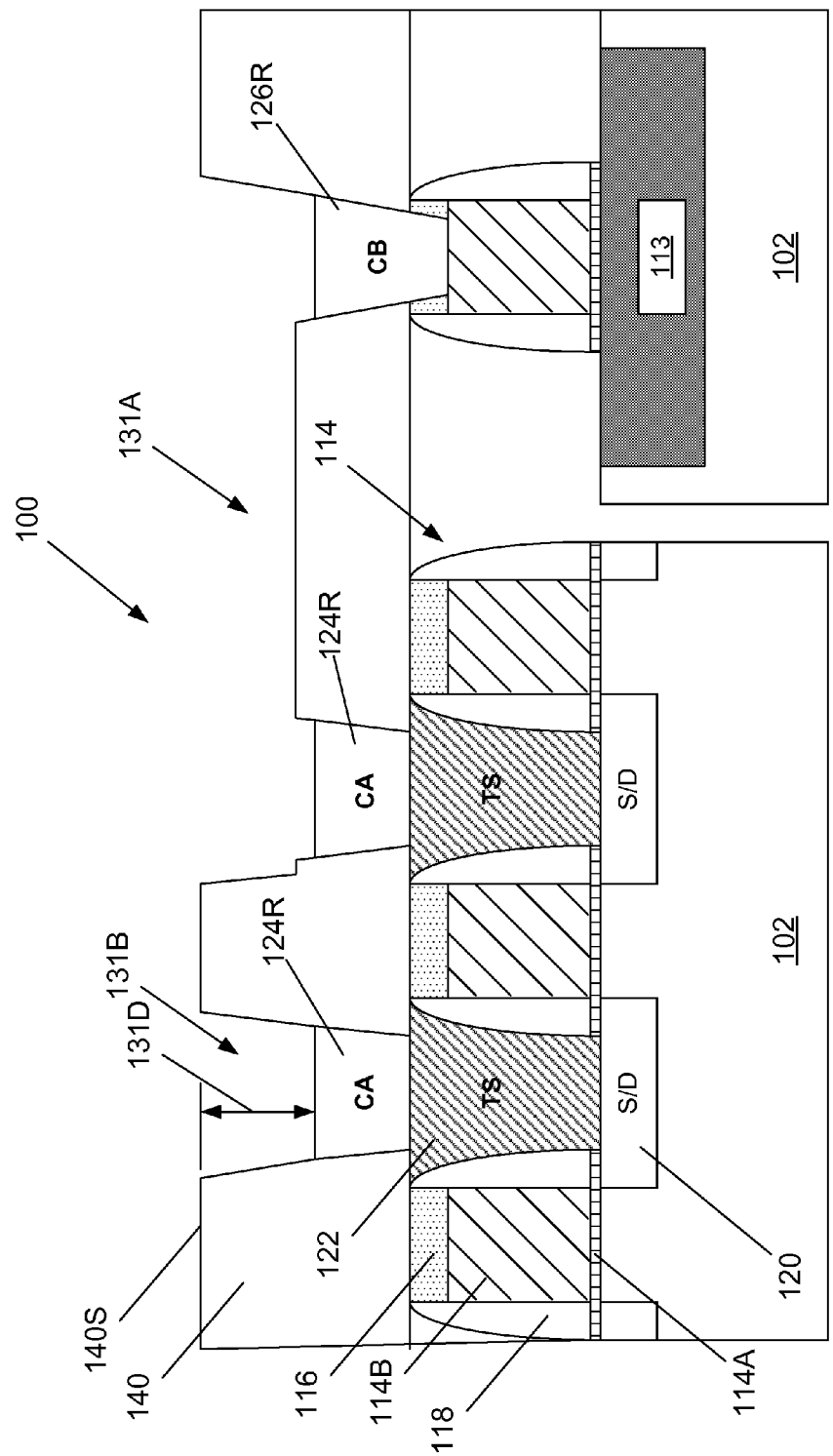
FIGS. 3A-3E depict other illustrative methods disclosed herein of forming reduced resistance local interconnect structures and the resulting semiconductor devices.

FIGS. 3A-3E depict other illustrative methods disclosed herein of forming reduced resistance local interconnect structures and the resulting semiconductor devices. FIG. 3A depicts the product at a point in fabrication corresponding to that depicted in FIG. 2B, i.e., after the formation of recesses 131A-B in the second layer of insulating material 140 and after the formation of recessed CA contacts 124R and the recessed CB contact 126R.

Figure 3B:
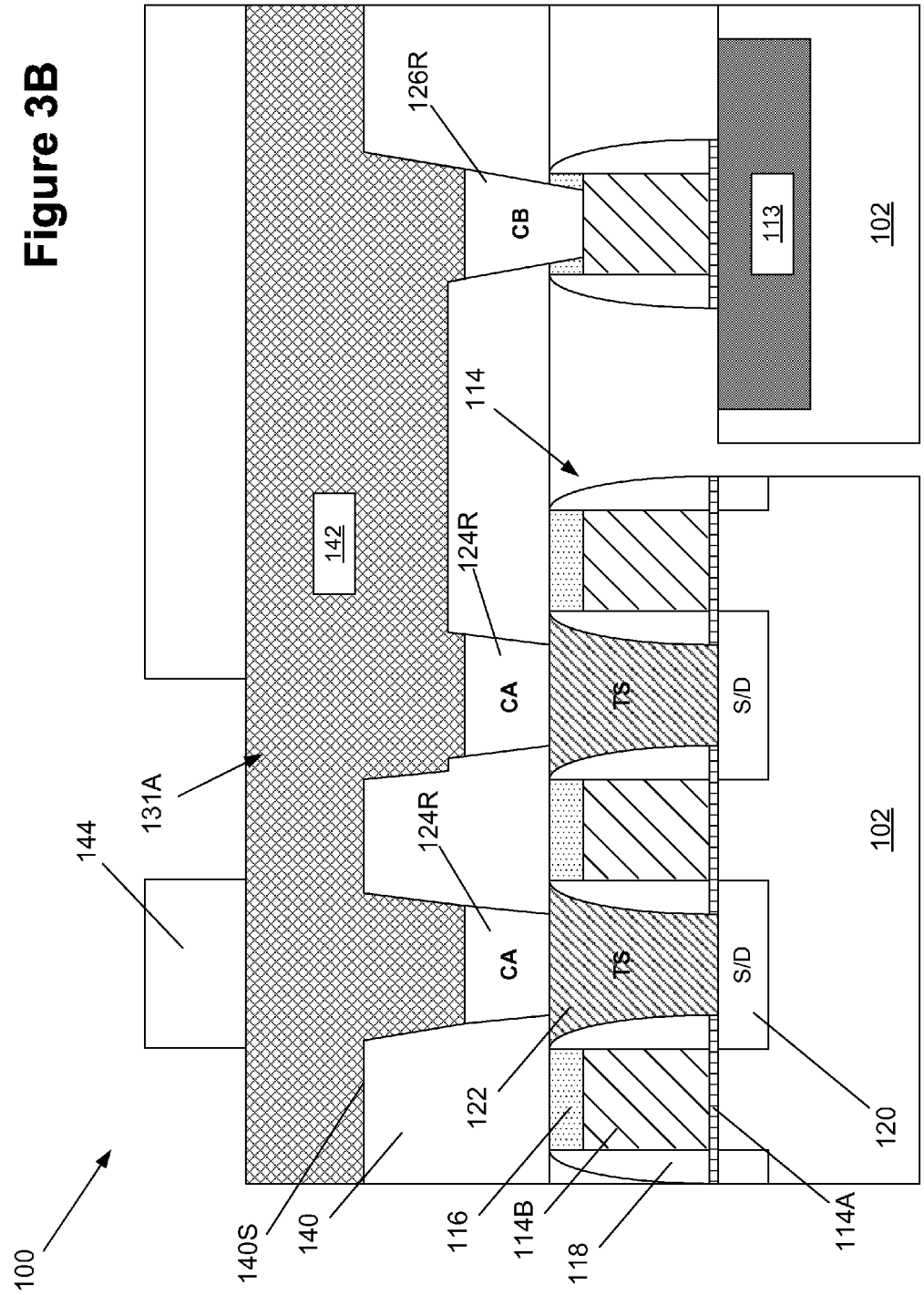

FIG. 3B depicts the product after the above-described layer of copper 142 was formed so as to over-fill the recesses 131A-B using traditional copper formation techniques. Also depicted in FIG. 3B is a patterned etch mask 144, e.g., a patterned layer of photoresist, that may be formed using traditional photolithography techniques.

Figure 3C:
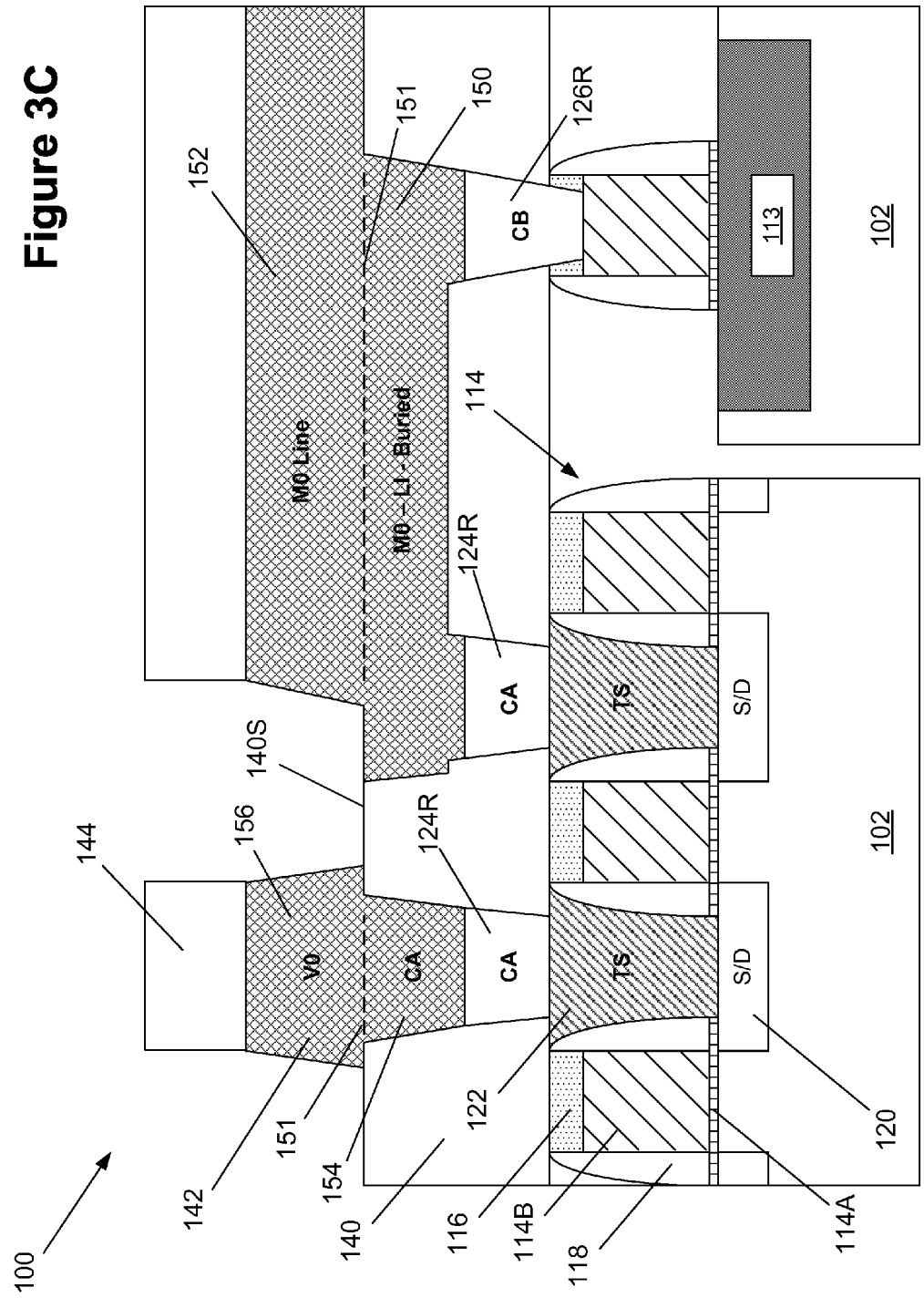

FIG. 3C depicts the product 100 after a timed etching process was performed through the patterned etch mask 144 to remove the exposed portions of the copper layer 142 that are positioned above the upper surface 140S of the layer of insulating material 140. The copper layer 142 may be directly etched using the methods disclosed in Joseph et. al, "Advanced Plasma Etch for the 10 nm node and Beyond," *Advanced Etch Technology for Nanopatterning II*, Proc. of SPIE, Vol. 8686, 86850A, Mar. 29, 2013, which is hereby incorporated by reference in its entirety. This operation results in the formation of the previously described copper local interconnect 150 (M0-LI-Buried) and the CA contact cap 154, as well as the formation of a conductive copper via 156 and a metal line 152 (M0 Line). The copper via 156 and the metal line 152 are positioned above the upper surface 140S of the second layer of insulating material 140. Note that the copper local interconnect 150 (M0-LI-Buried) and the metal line 152 (M0 Line) are all part of a single unitary structure. Similarly, the CA contact cap 154 and the conductive copper via 156 are all part of another unitary structure. The dashed lines 151 have been provided in FIG. 3C for reference purposes only.

Figure 3D:
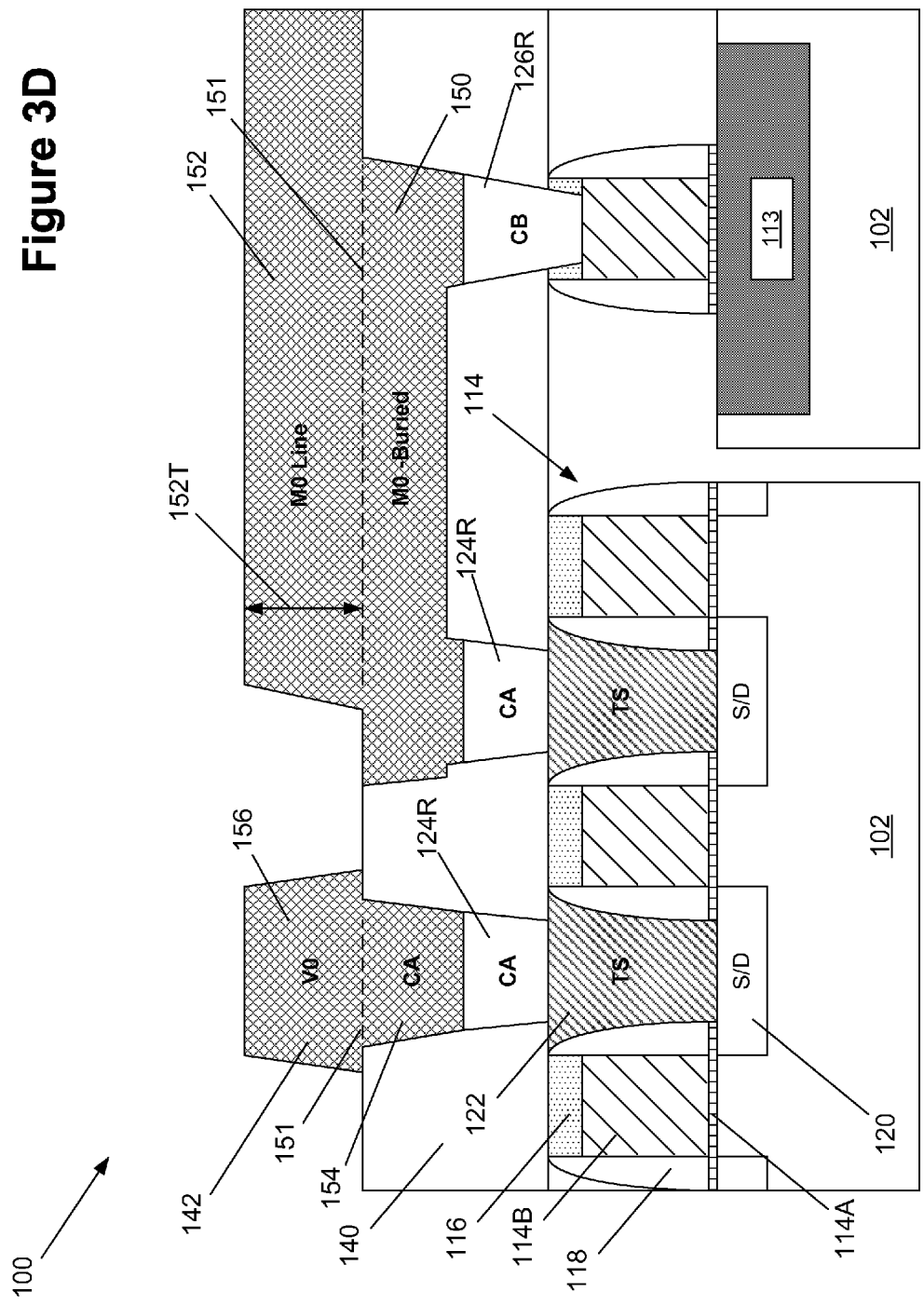

FIG. 3D depicts the product 100 after the patterned masking layer 144 has been removed.

Figure 3E:
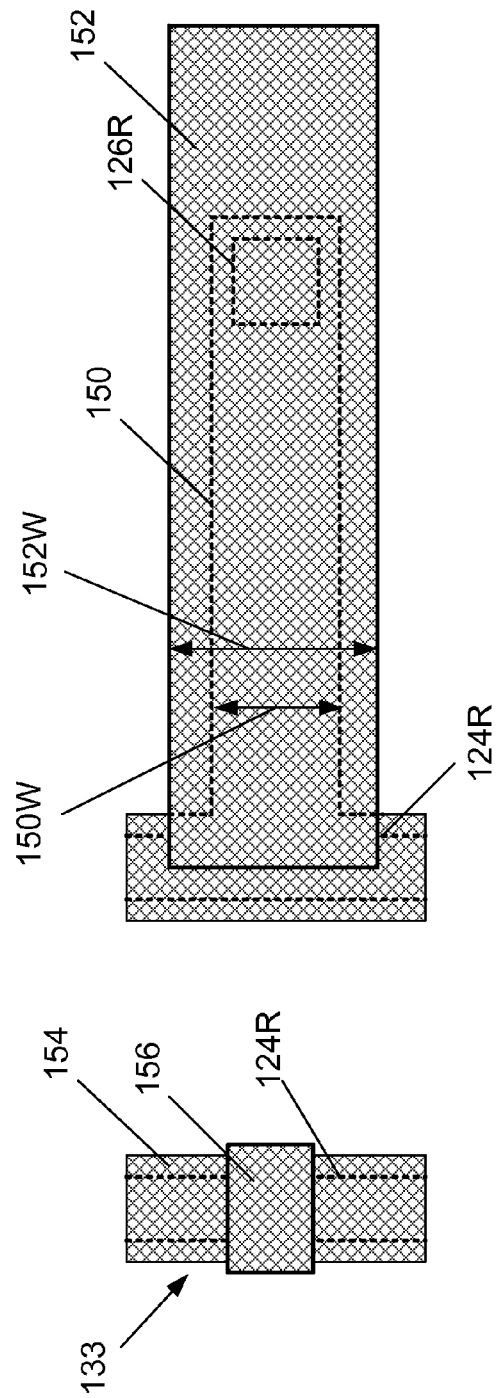

FIG. 3E is a simplistic plan view showing one possible embodiment of the recessed CA contacts 124R, the recessed CB contact 126R, the copper local interconnect 150, the CA contact cap 154, the metal line 152 (M0 Line) and the conductive copper via 156, with the second layer of insulating material 140 and other structures omitted. In this embodiment, the recessed CA contacts 124R are line-type structures, the CA contact cap 154 is a line-type structure, the recessed CB contact 126R and the conductive via 156 have a generally square or rectangular configuration and the copper local interconnect 150 has an overall T-shaped configuration. The metal line 152 (M0 Line) may extend in any direction, it may be formed to any desired length and width 152W and it may be formed to any desired thickness 152T (see FIG. 3D). In the depicted example, the metal line 152 (M0 Line) is oriented in a direction that is substantially parallel to the long axis of the copper local interconnect 150. Also note that the width 152W may be substantially greater than the width 150W. Additional metallization layers (not shown) may then be formed above the M1 layer, e.g., M2/V1, M3/V2, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a layer of insulating material above first and second transistors that are formed above first and second spaced-apart active regions, respectively;
   within said layer of insulating material:
      forming a set of initial device-level contacts for each of said first and second transistors, wherein each set of initial device-level contacts comprises a plurality of source/drain contacts and a gate contact; and
      forming an initial local interconnect structure that is conductively coupled to one of said initial device-level contacts of said first transistor and conductively coupled to one of said initial device-level contacts of said second transistor;
   performing at least one recess etching process so as to remove said initial local interconnect structure and portions, but not all, of said initial device-level contacts for each of said first and second transistors so as to thereby define a local interconnect recess in said layer of insulating material and a plurality of recessed device-level contacts for each of said first and second transistors; and
   forming:
      a copper local interconnect structure in said local interconnect recess that is conductively coupled to one of said recessed device-level contacts of said first transistor and conductively coupled to one of said recessed device-level contacts of said second transistor; and
      a copper cap above each of said recessed device-level contacts of said first and second transistors that are not conductively coupled to said copper local interconnect structure.

2. The method of claim 1, wherein an upper surface of said copper local interconnect structure and an upper surface of each of said copper caps is substantially planar with an upper surface of said layer of insulating material.

3. The method of claim 1, wherein said initial device-level contacts of each of said first and second transistors and said initial local interconnect structure is comprised of the same first material.

4. The method of claim 3, wherein said first material is tungsten.

5. The method of claim 1, wherein said initial device-level contacts for each of said first and second transistors and said initial local interconnect structure are formed by:
performing at least one common deposition process operation to deposit a first material into openings formed in said layer of insulating material; and
performing at least one common CMP process to remove portions of said first material positioned outside of said openings and above an upper surface of said layer of insulating material.

6. The method of claim 1, wherein said source/drain contacts are line-type structures and said gate contact is a post-type structure.

7. The method of claim 1, wherein said source/drain contacts comprise a trench silicide structure.

8. The method of claim 1, wherein said copper local interconnect structure is formed such that it has a first self-aligned contact interface with said recessed device-level contact of said first transistor and a second self-aligned contact interface with said recessed device-level contact of said second transistor.

9. The method of claim 8, wherein each of said copper caps is formed such that it has a self-aligned contact interface with said recessed device-level contact to which said copper cap is conductively coupled.

10. A method, comprising:
forming a layer of insulating material above first and second transistors that are formed above first and second spaced-apart active regions, respectively;
within said layer of insulating material:
forming a set of initial device-level contacts for each of said first and second transistors, wherein each set of initial device-level contacts comprises a plurality of source/drain contacts and a gate contact; and
forming an initial local interconnect structure that is conductively coupled to one of said initial device-level contacts of said first transistor and conductively coupled to one of said initial device-level contacts of said second transistor, wherein said initial device-level contacts of each of said first and second transistors and said initial local interconnect structure are comprised of the same first material;
performing at least one recess etching process so as to remove said initial local interconnect structure and portions, but not all, of said initial device-level contacts for each of said first and second transistors so as to thereby define a local interconnect recess in said layer of insulating material and a plurality of recessed device-level contacts for each of said first and second transistors; and
forming:
a copper local interconnect structure in said local interconnect recess that is conductively coupled to one of said recessed device-level contacts of said first transistor and conductively coupled to one of said recessed device-level contacts of said second transistor; and
a copper cap above each of said recessed device-level contacts of said first and second transistors that are not conductively coupled to said copper local interconnect structure, wherein an upper surface of said copper local interconnect structure and an upper surface of each of said copper caps is substantially planar with an upper surface of said layer of insulating material.

11. The method of claim 10, wherein said first material is tungsten.

12. The method of claim 10, wherein said initial device-level contacts for each of said first and second transistors and said initial local interconnect structure are formed by:
performing at least one common deposition process operation to deposit a first material into openings formed in said layer of insulating material; and
performing at least one common CMP process to remove portions of said first material positioned outside of said openings and above an upper surface of said layer of insulating material.

13. The method of claim 10, wherein said source/drain contacts are line-type structures and said gate contact is a post-type structure.

14. The method of claim 10, wherein said source/drain contacts comprise a trench silicide structure.

15. A method, comprising:
forming a layer of insulating material above first and second transistors that are formed above first and second spaced-apart active regions, respectively;
within said layer of insulating material:
forming a set of initial device-level contacts for each of said first and second transistors, wherein each set of initial device-level contacts comprises a plurality of source/drain contacts and a gate contact; and
forming an initial local interconnect structure that is conductively coupled to one of said initial device-level contacts of said first transistor and conductively coupled to one of said initial device-level contacts of said second transistor;
performing at least one recess etching process so as to remove said initial local interconnect structure and portions, but not all, of said initial device-level contacts for each of said first and second transistors so as to thereby define a local interconnect recess in said layer of insulating material and a plurality of recessed device-level contacts for each of said first and second transistors; and
forming a layer of copper so as to over-fill said local interconnect recess and an opening in said layer of insulating material above each of said recessed device-level contacts, wherein said layer of copper has a substantially planar upper surface that is positioned above an upper surface of said layer of insulating material and wherein formation of said layer of copper results in the formation of:
a copper local interconnect structure in said local interconnect recess that is conductively coupled to one of said recessed device-level contacts of said first transistor and conductively coupled to one of said recessed device-level contacts of said second transistor; and
a copper cap above each of said recessed device-level contacts of said first and second transistors that are not conductively coupled to said copper local interconnect structure;
forming a patterned etch mask above the upper surface of said layer of copper; and
performing an etching process through said patterned etch mask to remove portions of said layer of copper positioned above said upper surface of said layer of insulating material so as to thereby define a copper line that is formed integral with said copper local interconnect structure and a copper via that is formed integral with at least one of said copper caps, wherein said copper line and said copper via are positioned above said upper surface of said layer of insulating material.

16. The method of claim 15, wherein said initial device-level contacts of each of said first and second transistors and said initial local interconnect structure is comprised of the same first material.

17. The method of claim 16, wherein said first material is tungsten.

* * * * *